(12) United States Patent
van Dommelen et al.

(10) Patent No.: US 10,454,424 B2
(45) Date of Patent: Oct. 22, 2019

(54) BOOST CONTROL SIGNAL GENERATOR

(71) Applicant: NXP B.V., Eindhoven (NL)

(72) Inventors: Maarten van Dommelen, Nijmegen (NL); Frédéric Chalet, Cannes la Bocca (FR); Benno Krabbenborg, Arnhem (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/119,115

(22) Filed: Aug. 31, 2018

(65) Prior Publication Data

US 2019/0131931 A1 May 2, 2019

(30) Foreign Application Priority Data

Oct. 31, 2017 (EP) .................................. 17306505

(51) Int. Cl.
*H04R 3/00* (2006.01)
*H03F 1/02* (2006.01)
*H03K 5/133* (2014.01)
*H03F 3/183* (2006.01)
*H03F 3/217* (2006.01)
*H03F 3/181* (2006.01)
*H03K 5/00* (2006.01)

(52) U.S. Cl.
CPC ......... *H03F 1/0205* (2013.01); *H03F 1/0227* (2013.01); *H03F 3/181* (2013.01); *H03F 3/183* (2013.01); *H03F 3/217* (2013.01); *H03K 5/133* (2013.01); *H04R 3/00* (2013.01); *H03F 2200/03* (2013.01); *H03F 2200/102* (2013.01); *H03F 2200/321* (2013.01); *H03K 2005/00241* (2013.01)

(58) Field of Classification Search
CPC ........ H03F 1/0205; H03F 3/183; H03F 3/217; H03F 2200/03; H03K 5/133; H03K 2005/00241
USPC .............................................. 381/120, 58–59
See application file for complete search history.

(56) References Cited

U.S. PATENT DOCUMENTS

| | | | | |
|---|---|---|---|---|
| 9,362,875 | B2 * | 6/2016 | Blyth | ..................... H03F 1/0227 |
| 10,243,524 | B2 * | 3/2019 | Orr | ........................ H03F 1/0227 |
| 10,264,371 | B2 * | 4/2019 | Larsen | ..................... H02M 3/07 |
| 2007/0258602 | A1 | 11/2007 | Vepsalainen et al. | |

(Continued)

FOREIGN PATENT DOCUMENTS

| | | |
|---|---|---|
| EP | 2270975 A2 | 1/2011 |
| EP | 2270975 A3 | 1/2011 |
| GB | 2515819 A | 1/2015 |

OTHER PUBLICATIONS

NXP; "TFA9892—12 V boosted audio system with adaptive sound maximize and speaker protection"; Product short data sheet—Rev. 1.0; 27 pages (Sep. 1, 2017).

(Continued)

*Primary Examiner* — Disler Paul

(57) ABSTRACT

A method and operates for generating a boost control signal for a DC-DC-booster is described. An audio signal may be received comprising a plurality of audio sample values. The audio signal may be delayed for a delay time. A maximum-delayed-value of the audio sample values during the delay time may be determined. The boost control signal may be generated from the maximum of the non-delayed audio signal sample value and the maximum-delayed-value.

12 Claims, 5 Drawing Sheets

(56) References Cited

U.S. PATENT DOCUMENTS

2014/0111276 A1 4/2014 Mathe et al.
2018/0337637 A1* 11/2018 Galal .................... H03F 1/0216

OTHER PUBLICATIONS

NXP; "TFA9872_SDS—High Efficiency Class-D Audio Amplifier with Speaker-as-Microphone—Product short data sheet"; Rev. 1; 32 pages (Apr. 12, 2017).

* cited by examiner

BOOST CONTROL SIGNAL GENERATOR

CROSS-REFERENCE TO RELATED APPLICATIONS

This application claims the priority under 35 U.S.C. § 119 of European patent application no. 17306505.3, filed Oct. 31, 2017 the contents of which are incorporated by reference herein.

FIELD

This disclosure relates to a boost control signal generator for a DC-DC booster.

BACKGROUND

Mobile devices, for example mobile phones, typically include audio amplifiers which are intended to be mainly powered by battery. To achieve the desired audio output power level, a controlled voltage source may be used to generate the supply voltage of the audio amplifier. To improve the efficiency, the desired amplifier supply voltage may be increased only if the battery voltage is insufficient. This may be done by controlling the voltage source dependent on the amplitude level of the input audio signal. In many mobile devices, the controlled voltage source may be a DC-DC booster having capacitor at its output that is charged or discharged to vary the output voltage. The ramp-up time of the DC-DC booster is controlled to limit the peak-current drawn from the battery when the capacitor is charging up. Consequently, the DC-DC booster output reaches the target amplifier supply voltage somewhat later than required. When the DC-DC booster provides the required amplifier supply voltage later than required, the audio signal will be clipped resulting in audible distortion. The audio signal may be delayed to compensate for the DC-DC booster delay.

SUMMARY

Various aspects of the disclosure are defined in the accompanying claims. In a first aspect, there is provided a boost control signal generator for controlling a DC-DC-booster, the boost control signal generator comprising: a boost control input configured to receive an audio signal comprising a plurality of audio sample values; a delay line having a delay line input coupled to the boost control input and a delay line output wherein the delay line is configured to output a maximum delayed value of the delayed audio sample values; a maximum value detector having a first input coupled to the boost control input, a second input coupled to the delay line output and an output coupled to the boost control output, wherein the maximum value detector is configured to output the maximum of the audio sample value and the maximum delayed value.

In one or more embodiments, the delay line further comprises at least one delay element coupled to the delay stage input, a delay stage maximum value detector having an input coupled to the at least one delay element and an output coupled to the delay line output.

In one or more embodiments, the delay line comprises a plurality of delay stages arranged between the delay line input and the delay line output, each of the delay-stages including a delay-stage-input, a delay-stage-output and a delay-stage-maximum-value-detector coupled to the respective delay-stage-output; wherein in operation the sample rate of each delay stage is less than the sample rate of the preceding delay stage.

In one or more embodiments, each of the plurality of delay-stages comprises at least one delay element, and wherein each delay-stage-maximum-value-detector has at least one input coupled to the at least one delay element output and an input coupled to the delay-stage-input.

In one or more embodiments, the plurality of delay-stages comprises a first delay-stage and a second delay-stage, wherein the first delay-stage-input is coupled to the delay line input, the first delay-stage-output is coupled to the second delay-stage-input, and the second delay-stage-output is coupled to the delay line output and wherein the second delay stage is configured to down-sample the output of the first delay stage.

In one or more embodiments, the first delay-stage is configured to receive an audio signal which has been up-sampled by an up-sampling factor, U, and the second delay-stage is configured to operate at the original audio sample frequency.

In one or more embodiments, the first delay-stage comprises only one delay element, the maximum value detector is arranged to feedback the peak value to the first delay-stage input and wherein the delay element is reset every U cycles.

In one or more embodiments, the first delay-stage comprises a modulo-U counter coupled to a resettable delay element.

In one or more embodiments, the boost control signal generator comprises an up-sampler having an audio signal input configured to receive an audio signal sampled at a sample frequency and an audio signal output coupled to the delay line input.

In one or more embodiments, the boost control signal generator comprises an absolute value calculator having an input coupled to the up-sampler output an output coupled tot the delay line input and the maximum value detector input.

One or more embodiments of the boost control signal generator may be included in a DC-DC-boost controller, wherein the DC-DC-boost controller is configured to vary the dc-supply to an audio amplifier in response to the generated boost control signal.

The DC-DC boost controller may be included in an audio amplifier.

In a second aspect, there is described a method of generating a control signal for a DC-DC-boost controller, the method comprising receiving an audio signal; delaying the audio signal for a delay time; determining a maximum-delayed-value of the audio signal during the delay time; and determining the maximum of the non-delayed audio signal and the maximum-delayed-value.

In one or more embodiments, delaying the audio signal further comprises delaying an audio signal with a plurality of delay stages; determining a maximum value of the audio signal in each of the delay stages; providing the determined maximum value of the audio signal in each delay stage to the succeeding delay stage; and wherein the determined maximum-delayed-value is the determined maximum value of the final delay stage.

In one or more embodiments, delaying the audio signal comprises storing the audio signal in a memory for at least the delay time.

In a third aspect, there is described a computer program product comprising instructions which, when being executed by a processing unit, cause said processing unit to perform the steps of generating a control signal for a DC-DC-boost controller by receiving an audio signal; delaying the audio signal for a delay time; determining a maximum-delayed-value of the audio signal during the delay time; and determining the maximum of the non-delayed audio signal and the maximum-delayed-value.

BRIEF DESCRIPTION OF DRAWINGS

In the figures and description like reference numerals refer to like features. Embodiments of are now described in detail, by way of example only, illustrated by the accompanying drawings in which.

DESCRIPTION

Figure 1:
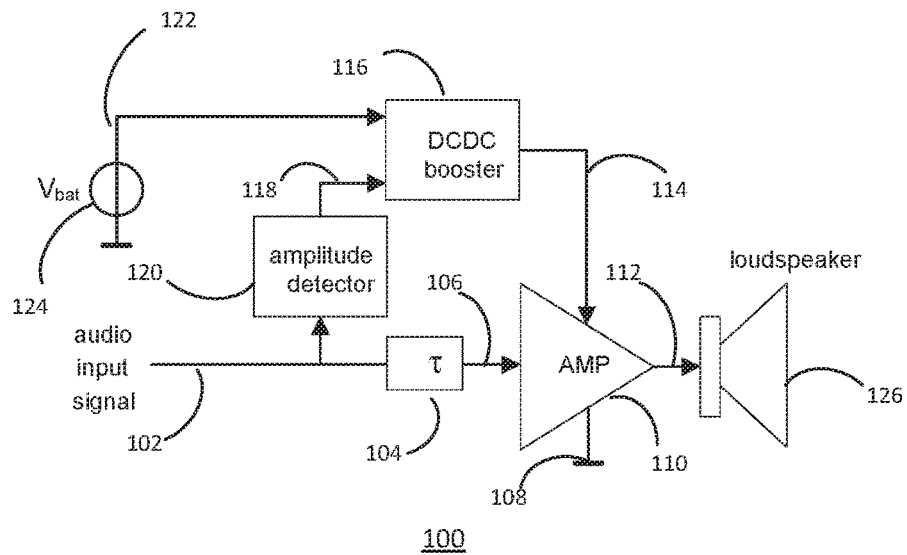
FIG. 1 shows a typical example audio amplifier system including an amplitude detector and a boost converter.

FIG. 1 shows a typical example audio amplifier system 100.

An audio delay 104 may have an input coupled to the audio input 102 and an output coupled to an amplifier input 106 of audio amplifier 110 which may for example be a class-D audio amplifier. An amplifier output 112 may be connected to a speaker 126. The amplifier 110 may have a ground connection 108.

An amplitude detector 120 may have an output 118 connected to a control input of a DC-DC booster 116. The amplitude detector 120 may have an input connected to the audio input 102.

The DC-DC booster 116 may have a supply input 122 connected to a battery 124. The DC-DC booster 116 may have an output 114 connected to the amplifier 110.

The audio system 100 delays an incoming audio signal by an amount, denoted ti, to compensate for the delay in ramp up of the DC-DC booster. The amplitude detector 120 may detect the amplitude and, based on the amplitude, generate a booster control signal with a delay on the amplitude detector output 118.

Figure 2:
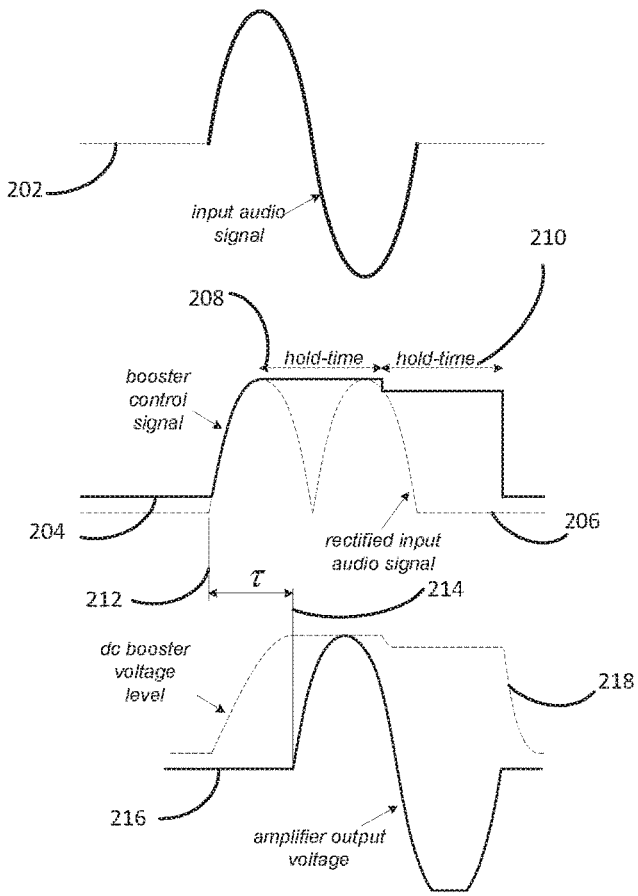
FIG. 2 illustrates a typical boost converter control signal generated by the amplitude detector for a sinusoid audio signal.

The amplitude detector 120 typically includes a monostable multi-vibrator circuit (not shown) also known as a "one-shot" circuit which maintains the last required amplifier voltage level for the delay time τ. The behaviour of the amplitude detector 120 is illustrated in FIG. 2 which shows an example input audio signal 202 consisting of one period of a sinusoid preceded by silence and followed by silence, a rectified version of the audio signal 206, the booster control signal 204, the DC booster voltage level 218 and the amplifier output voltage 216. The delay time τ corresponds for example to the time between lines 212 and 214. The amplitude detector 120 generates a boost control signal on the amplifier detector output 118 at a peak value of the audio input for a first hold time 208 and a second value below the peak value of the audio input signal for a second hold time 210. The DC booster voltage level 218 follows the booster control signal level. In this case because the voltage supplied is less than the peak audio signal level during the second hold time 210, amplifier clipping may occur. In other cases, the amplifier 110 may be supplied with a higher voltage than necessary for the audio input signal resulting in loss of efficiency.

Figure 3:
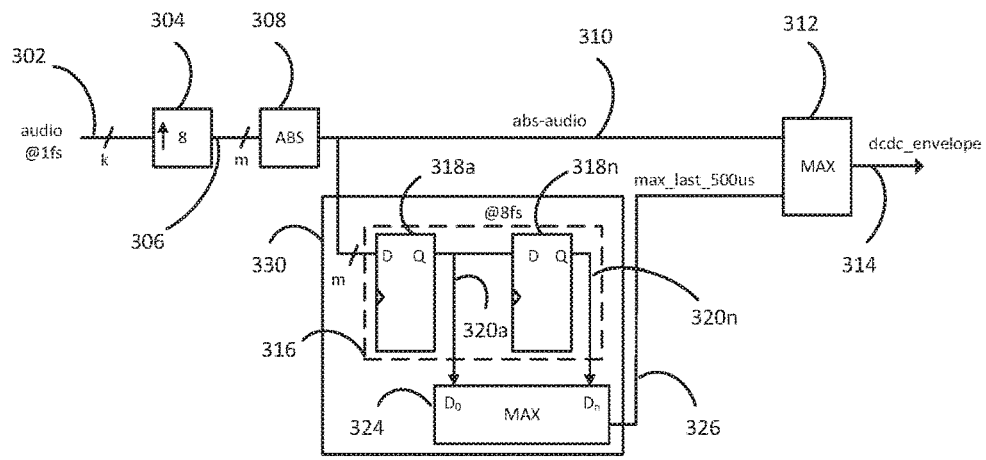
FIG. 3 shows a boost control signal generator according to an embodiment.

FIG. 3 shows a boost control signal generator 300 for a DC-DC boost converter according to an embodiment. The boost control signal generator 300 may replace the amplitude detector 120 in the amplifier system 100 of FIG. 1. An audio signal input 302 may be connected to an up-sampler 304. An output of audio up-sampler 304 may be connected to an input 306 of absolute value calculator 308. The absolute value calculator output 310 may be connected to a first input of a maximum value detector 312. The absolute value calculator output 310 may be connected to the input of a delay line 330. The delay line 330 may include a shift register 316 and a maximum value detector 324.

The shift register 316 may include a number (n) of registers 318a to 318n arranged in series. As illustrated, each register may be m-bits wide. Each of the registers 318a to 318n may be considered to be a delay element. In FIG. 3, only the first register 318a and the nth register 318n are shown. Each register may include m-flip-flops, although only one flip-flop is shown in FIG. 3. The outputs 320a to 320n of each register from each flip-flop may be connected to the input of the corresponding flip-flop in the next register. The respective outputs 320a to 320n of each flip flop in a register may be connected to the maximum value detector 324. The output 326 of the maximum value detector 324 may be connected to a second input of the maximum value detector 312. The output of the maximum value detector 312 may be connected to the output 314 of the boost signal generator 300.

In operation, an audio signal which has been sampled at a sample frequency $f_s$ may be received on the audio input 302. Each audio sample of the audio signal may be k-bits wide. The audio signal may be sampled-up by a factor of 8 times by up-sampler 304. The up-sampler 304 may alter the number of bits of each sample to m-bits. In other examples, the up-sampler 304 may leave the number of bits unchanged and so the value of k and m may be equal. The absolute value calculator 308 may determine the absolute value of the up-sampled audio signal. The output of the absolute value calculator 308 may be considered to be a rectified audio signal. The absolute value of the up-sampled audio signal will now be delayed by registers 318a to 318n in the delay line 330 for a delay time τ. The registers 318a to 318n may be supplied by a clock at the up-sample frequency $8f_s$. For a required booster ramp up time τ, the length of the delay line may be τ*U*fs. In one example the delay time τ may be 500 us, the sample frequency fs may be 48 kHz, and in the example given up-sample factor U is equal to 8. This means that n=τ*U*fs=192. For a value of m=12, corresponding to registers which are each 12-bit wide, the delay line 330 may be implemented with 2304 flip-flops. In some examples, if the sample frequency $f_s$ of the audio signal is high enough, the up-sampler 304 may be omitted.

The maximum value detector 324 may determine a maximum value of all the registers 318a to 318n and output the maximum value on the delay line output 326 which corresponds to the maximum value of the samples for a previous time τ. The maximum value detector 312 may determine the boost control signal value from a maximum of the maximum value of the samples in the delay line and the current audio sample. The boost control signal value may be output on the boost signal generator output 314. In some examples the maximum value detectors 312, 324 may also determine the absolute value of the samples in which case the separate absolute value calculator 308 may be omitted.

Figure 4A:
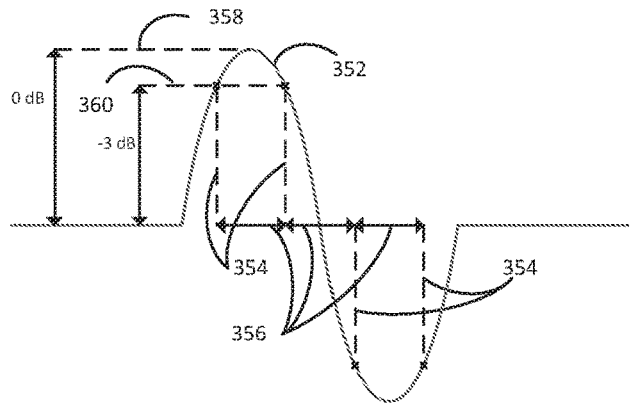
FIG. 4A shows a waveform illustrating the effect of a low sample rate or insufficient oversampling.

If the audio signal is not oversampled, audio signals at a frequency of fs/4 may result in the envelope level being too low. This is illustrated in FIG. 4A in waveform 350. An example audio signal 352 having a frequency of fs/4 worst case has a ratio $T_{sig}/T_{sample}$ of 4 where $T_{sig}$ is the signal time period and $T_{sample}$ is the sample time period. The audio signal 352 may be sampled at four points 354, which are a time interval 356 ($T_{sig}/4$) apart. The sampled values may have absolute values 3 dB below the peak value 358 indicated by line 360. This may be corrected by applying a uniform 3 dB boost to the detected level. Applying a uniform 3 dB boost may result in supplying a higher voltage than necessary for signals which do not have fs/4 components. Consequently, the efficiency of the power supply may be reduced.

Figure 4B:
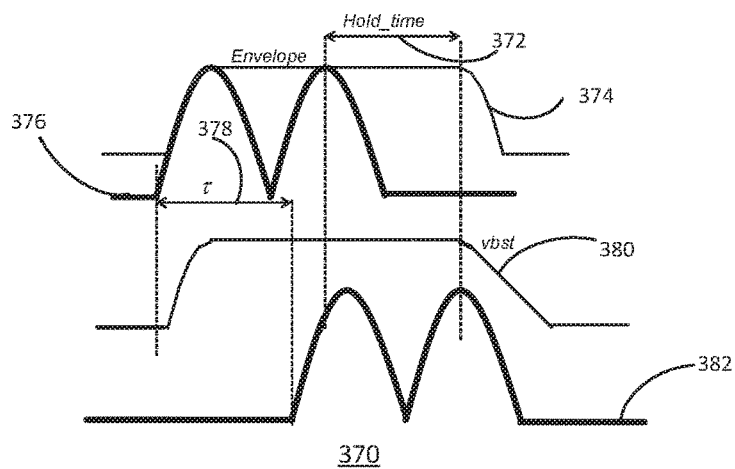
FIG. 4B shows a waveform illustrating the behaviour of the boost control signal generator of FIG. 3.

FIG. 4B shows waveforms 370 which illustrate the behaviour of the boost control signal generator 300 for an example audio signal consisting of a single sinusoid. The rectified audio signal after the absolute value calculator 308 is shown by line 376. The signal at the output of the delay line 330 is shown by line 382. The delayed signal is delayed by a time (τ) 378. The generated control signal is shown by line 374 and corresponds to the envelope of the up-sampled rectified audio signal 376 and the delayed signal 382. The corresponding boost voltage is shown by line 380. By generating the boost control signal from the envelope of the audio signal and the delayed audio signal, the boost voltage is increased prior to the audio signal arriving at the amplifier which corresponds to the delayed audio signal 382. The boosted voltage is held for a hold time 372 corresponding to the delay time τ until audio signal level 382 decreases. The resolution of the envelope signal may be lower than the resolution of the audio signal, dependent on the control resolution of the DC-DC booster. By generating a booster control signal from the envelope of the audio signal and the delayed audio signal, the DC-DC boost control voltage may be controlled with minimal headroom and consequently more efficiency without resulting in amplifier clipping.

Figure 5:
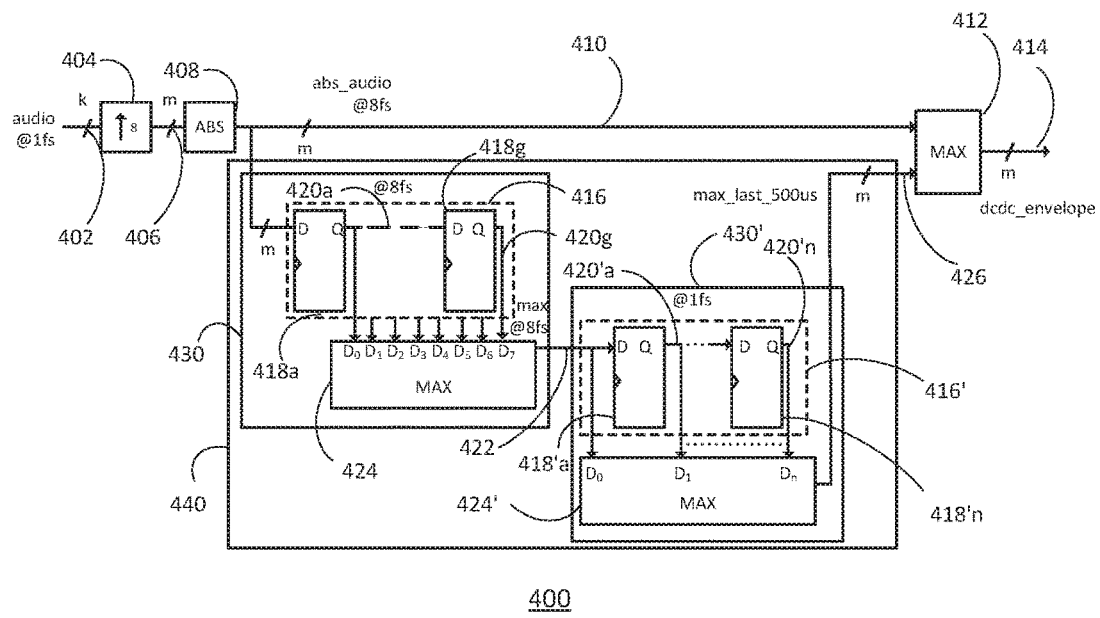
FIG. 5 shows a boost control signal generator according to an embodiment.

FIG. 5 shows a boost control signal generator 400. The boost control signal generator 400 may replace the amplitude detector 120 in the amplifier system 100 of FIG. 1. An audio signal input 402 may be connected to an up-sampler 404. An output of audio up-sampler 404 may be connected to an input 406 of absolute value calculator 408. The absolute value calculator output 410 may be connected to a first input of a maximum value detector 412. The absolute value calculator output 410 may be connected to the input of a delay line 440. The delay line 440 may include a first delay-stage 430 and a second delay-stage 430'

The first delay-stage 430 may include a shift register arrangement including eight registers 418a to 418g arranged in series. Only the first register 418a and the last (eighth register) 418g are shown explicitly. As illustrated, each register may be m-bits wide. Each register includes a number of flip-flops, only one being shown. The outputs 420a to 420g of each register from each flip-flop may be connected to the input of the corresponding flip-flop in the next register. The respective outputs 420a to 420g of each flip flop in a register may be connected to a first stage maximum value detector 424. The output of the first stage maximum value detector 424 may be connected to the output 422 of the first delay-stage 430. In some examples, the input of the register 420a may also be connected to the first stage maximum value detector 424.

The second delay-stage 430' may include a shift register 416' having a number (n) of registers 418'a to 418'n arranged in series. As illustrated, each register may be m-bits wide. Each register includes a number of flip-flops, only one being shown. The outputs 420'a to 420'n of each register from each flip-flop may be connected to the input of the corresponding flip-flop in the next register. The respective outputs 420'a to 420'n of each flip flop in a register may be connected to the maximum value detector 424'. The second stage maximum value detector 424' may be connected to the first delay-stage output 422. The output of the second stage maximum value detector 424' may be connected to the output 426 of the delay line 440.

The delay line output 426 may be connected to a second input of the maximum value detector 412. The output of the maximum value detector 412 may be connected to the output 414 of the boost signal generator 400.

In operation, an audio signal which has been sampled at a sample frequency $f_s$ may be received on the audio input 402. Each audio sample of the audio signal may be k-bits wide. The audio signal may be sampled-up by an up-sample factor of 8 times by up-sampler 404. In other examples, different up-sample factors may be used. Up-sample factors may be any integer value, typically a power of two. The up-sampler 404 may alter the number of bits of each sample to m-bits. In other examples, the up-sampler 404 may not alter the number of bits and so the value of k and m may be equal. In some examples, if the sample frequency is high enough, the up-sampler 404 may be omitted. The absolute value calculator 408 may determine the absolute value of the up-sampled audio signal. The output of the up-sampler 408 may be considered to be a rectified audio signal. The absolute value of the up-sampled audio signal may be delayed by registers 418a to 418g in the first delay stage 430. The registers 418a to 418g may be supplied by a clock at the up-sample frequency $8f_s$ (not shown) and so the shift register 416 operates at the up-sample frequency of 8fs. In other examples, if different up-sample frequencies are used, the first delay stage 416 may operate at those different up-sample frequencies. The first stage maximum value detector 424 may determine a maximum value of the delayed samples and output the maximum value to the second delay stage 430'.

The registers 418'a to 418'n in the second delay stage 430' may be supplied by a clock at the sample frequency $f_s$ (not shown) and so the shift register 416' operates at the sample frequency fs. The second stage maximum value detector 424' may determine a maximum value of the delayed samples and output the maximum value to the delay line output 426. Consequently, the second delay stage 430' operates at a lower sample rate than the first delay stage 430.

The maximum value detector 412 may determine the boost control signal value from a maximum of the maximum value of the samples in the delay line and the current audio sample. The boost control signal may be output on the boost control signal generator output 414.

Since the envelope of the audio signal may be detected at a lower resolution than the up-sample rate, the delay line 440 resamples the maximum signal at the up-sampled rate of 8fs in the first delay stage 430 at a lower frequency fs in the second delay stage 430'. The shift register 416 in the first delay stage 430 may be reduced in length to a length equal to the up-sampling factor U which in this example is 8. The number of registers n in the second delay stage shift register 416' to achieve a delay equivalent to the boost ramp-up time is then τ*fs−1. For example, if τ is about 500 us, the sample frequency fs equals 48 kHz, and in the up-sample factor U is equal to 8, the total number of registers is U+(*fs−1)=31 registers of each 12-bit wide resulting in 372 Flip-flops. This is much fewer than the 2304 flip-flips used for the delay line in boost signal generator 300.

Figure 6:
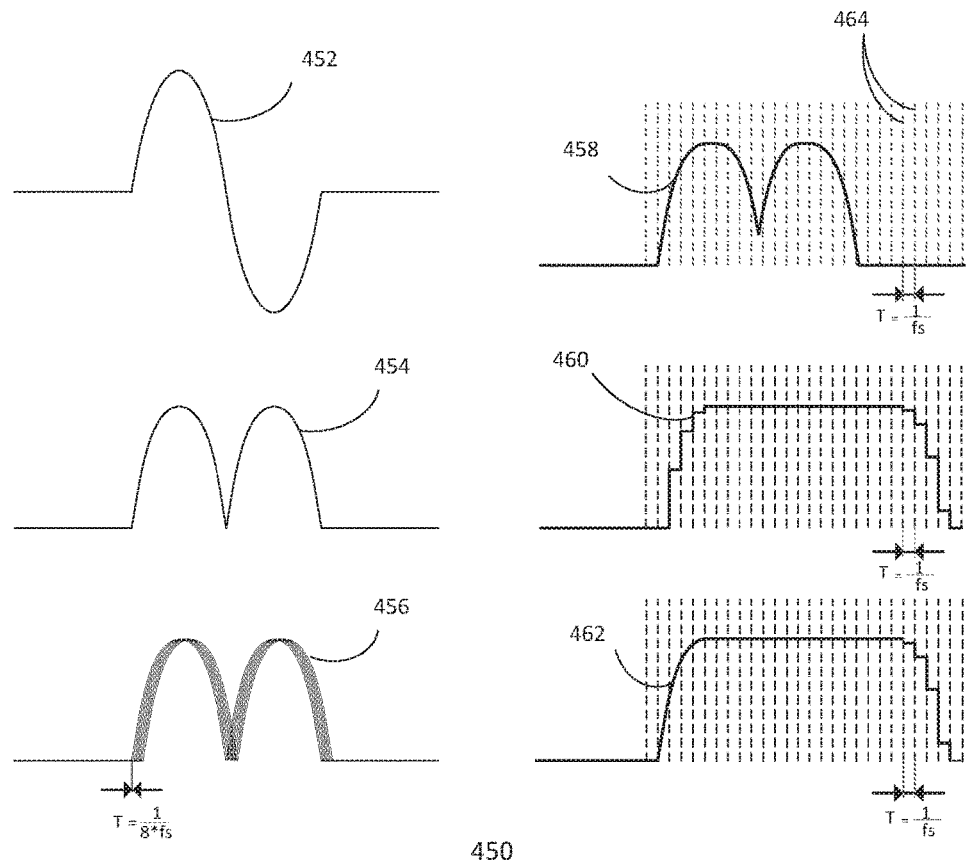
FIG. 6 shows an example waveform at various nodes in the boost signal generator of FIG. 5.

FIG. 6 illustrates waveforms 450 showing the behaviour of the boost control signal generator 400 for an example audio signal consisting of a single sinusoid. Line 452 shows the example audio input signal which has one single sinewave period preceded by silence and followed by silence. The rectified audio signal at the output 410 of the absolute value calculator 408 is shown by line 454. The signal at the outputs 420*a*-420*g* of the shift register 416 of the first delay-stage 430 is shown by line 456. The output 422 of the maximum detector 424 of the first delay-stage 430 is shown by line 458. The signal at the delay line output 426 corresponding to the output of the second delay stage 430' is shown by line 460. The signal at boost control signal output 414 is shown by line 462. The dashed lines 464 indicate time intervals between each audio sample at the original sample frequency fs, that is to say, T=1/fs.

The generated control signal shown by line 462 corresponds to the envelope of the up-sampled rectified audio signal 454 and a delayed version of the audio signal. By generating the boost control signal from the envelope of the audio signal and the delayed signal, the boost voltage is increased prior to the audio signal arriving at the amplifier. The boosted voltage is held for a hold time until audio signal level decreases. The booster control signal generated from the envelope of the audio signal and the delayed audio signal may allow the DC-DC-boost control voltage to be controlled with minimal headroom and consequently more efficiency without resulting in amplifier clipping. Since the resolution of the envelope may be less than the up-sampling frequency, the boost signal generator 400 uses a dual speed delay line 440 with two delay-stages 430, 430' running at different speeds. This may significantly reduce the complexity compared with boost signal generator 300.

Figure 7:
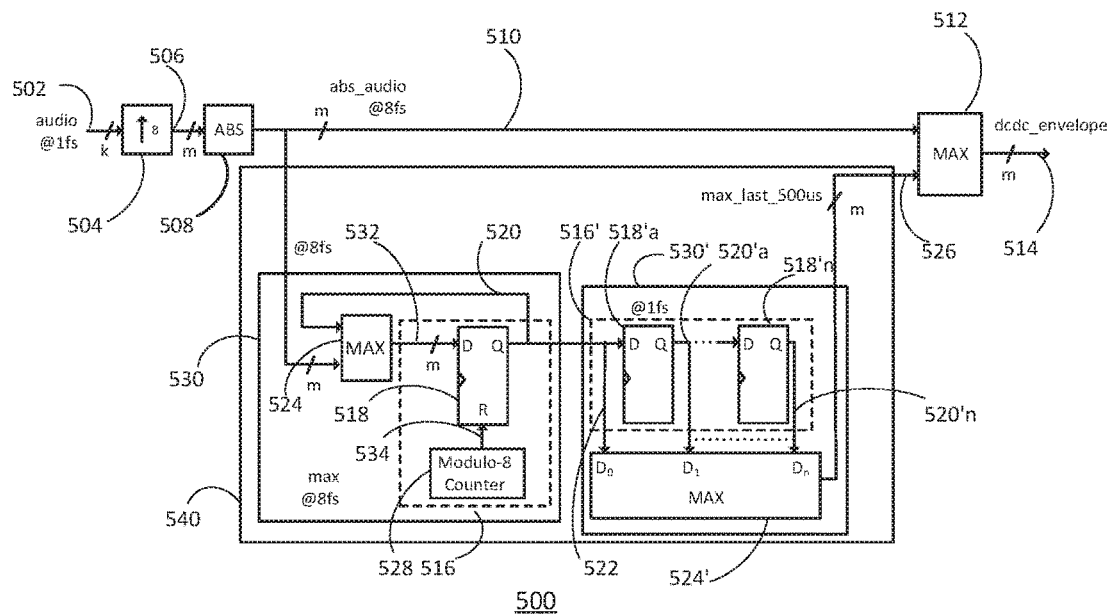
FIG. 7 shows a boost control signal generator according to an embodiment.

FIG. 7 shows a boost control signal generator 500. The boost control signal generator 500 may replace the amplitude detector in the amplifier system 100 of FIG. 1. An audio signal input 502 may be connected to an up-sampler 504. An output of audio up-sampler 504 may be connected to an input 506 of absolute value calculator 508. The absolute value calculator output 510 may be connected to a first input of a maximum value detector 512. The absolute value calculator output 510 may be connected to the input of a delay line 540. The delay line 540 may include a series arrangement of a first delay-stage 530 and a second delay-stage 530'.

The first delay-stage 530 may include a register arrangement 516 including a single register 518 and a modulo-8 counter 528. As illustrated, the register 518 may be m-bits wide. The register 518 includes m resettable flip-flops, only one being shown. The respective outputs 520 of each flip flop in the register 518 may be connected to a first input of the first stage maximum value detector 524. The register outputs 520 may be connected to the first delay stage output 522. The respective input 532 of each flip flop in the register 518 may be connected to the output of the first stage maximum value detector 524. A second input of the first stage maximum value detector 524 may be connected to the input of the first delay-stage 530. An output 534 of the modulo-8 counter 528 may be connected to the reset input of each of the resettable flip-flops in the register 518. The modulo-8 counter and the register 518 may be connected to a common clock connection (not shown) which runs at the up-sampling frequency.

The second delay-stage 530' may include a shift register 516' having a number n of registers 518'*a* to 518'*n* arranged in series. As illustrated, each register may be m-bits wide. Each register includes a number of flip-flops, only one being shown. The outputs 520'*a* to 520'*n* of each register from each flip-flop may be connected to the input of the corresponding flip-flop in the next register. The respective outputs 520'*a* to 520'*n* of each flip flop in a register may be connected to the maximum value detector 524'. The second stage maximum value detector 524' may have an input connected to the first delay-stage output 522. The first delay stage output 522 may be connected to the input of the first register 518'*a*. The output of the second stage maximum value detector 524' may be connected to the output 526 of the delay line 540.

The delay line output 526 may be connected to a second input of the maximum value detector 512. The output of the maximum value detector 512 may be connected to the output 514 of the boost signal generator 500.

In operation, an audio signal which has been sampled at a sample frequency $f_s$ may be received on the audio input 502. The audio signal may be sampled-up by an up-sample factor of 8 times by up-sampler 504. In other examples, a different up-sample factor U may be used. The absolute value calculator 508 may determine the absolute value of the up-sampled audio signal. The output of the up-sampler 508 may be considered to be a rectified audio signal. The first delay stage 530 has a single register 518 which is reset every 8 clock cycles by the modulo-8 counter 528. The register 518 and the modulo-8 counter 528 may be supplied by a clock at the up-sample frequency $8f_s$ (not shown). In other examples, if different up-sample frequencies are used, the first delay stage 530 may operate at those different up-sample frequencies and the modulo-8 counter 8 may be replaced in general by a modulo-U counter where U is the up-sampling factor. The first stage maximum value detector 524 may determine a maximum value of 8 samples which is output to the second delay stage 530' before the register 518 is reset by the modulo-8 counter 528.

The registers 518'*a* to 518'*n* in the second delay stage 530' may be supplied by a clock at the sample frequency $f_s$ (not shown) and so the shift register 516' operates at the sample fs. The second stage maximum value detector 524' may determine a maximum value of the delayed samples and output the maximum value to the delay line output 526. Consequently, the second delay stage 530' operates at a lower sample rate than the first delay stage 530.

The maximum value detector 512 may determine the boost control signal value from a maximum of the maximum value of the samples in the delay line and the current audio sample. The boost control signal may be output on the boost control signal generator output 514.

Since the envelope may be detected at a lower resolution than the up-sample rate, the delay line 540 resamples the maximum signal determined at the up-sampled rate of 8fs in the first delay stage 530 at a lower frequency fs in the second delay stage 530'.

The first delay stage 530 has a single register 518. The number of registers n in the second delay stage shift register 516' to achieve a delay equivalent to the boost ramp-up time is then τ*fs−1. For example, if τ is about 500 us, the sample frequency fs equals 48 kHz, and in the up-sample factor U is equal to 8, the total number of registers is 1+(τ*fs−1)=24 registers each 12-bit wide resulting in 288 Flip-flops. The boost signal generator 500 may have lower complexity than boost signal generator 300 and boost signal generator 400.

Figure 8:
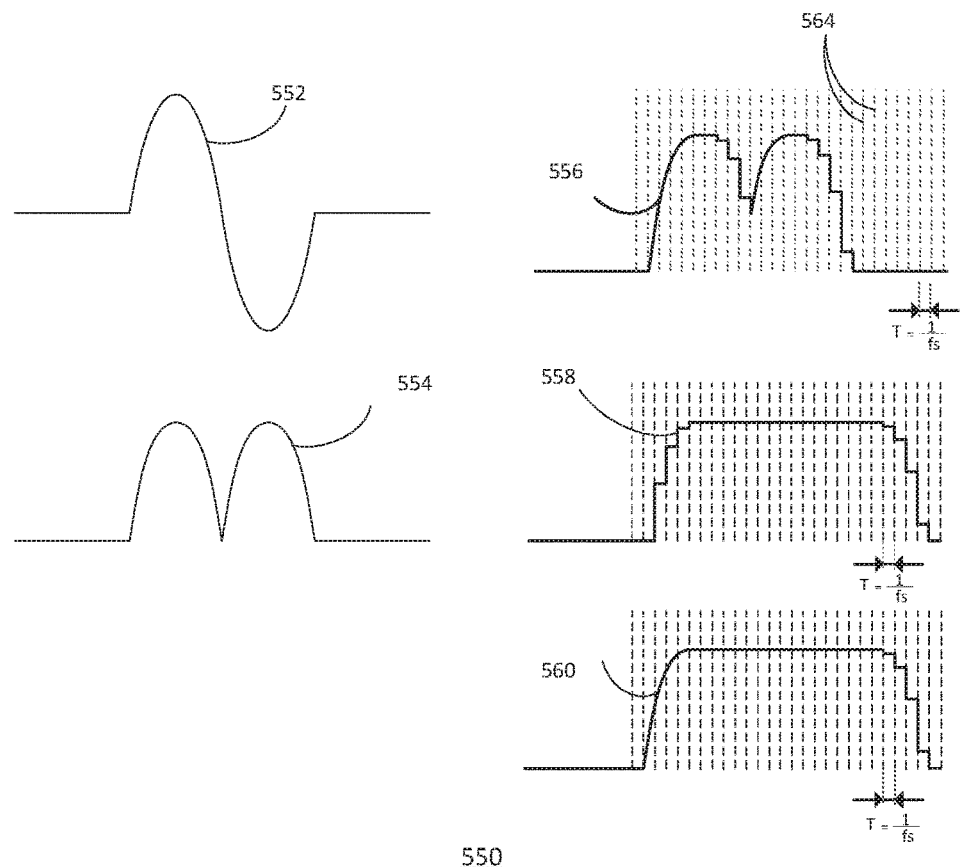
FIG. 8 shows an example waveform at various nodes in the boost signal generator of FIG. 7.

FIG. 8 shows waveforms 550 illustrating the behaviour of the boost control signal generator 500 for an example audio signal consisting of a single sinusoid. Line 552 shows the example audio input signal which has one single sinewave period preceded by silence and followed by silence. The rectified audio signal at the output 510 of the absolute value calculator 508 is shown by line 554. The output 532 of the maximum detector 524 of the first delay-stage 530 is shown by line 556. The signal at the delay line output 526 corresponding to the output of the second delay stage 530' is shown by line 558. The signal at boost control signal output 514 is shown by line 560. As can be seen by comparison with the waveforms for boost control signal generator 400, the only difference in behaviour is at the output of the maximum detector 524 of the first delay-stage 530 shown by line 556. The boost signal generator signal output 560 is the same as for the boost signal generator 400 illustrated in FIG. 6 line 462. The dashed lines 564 indicate time intervals between each audio sample at the original sample frequency fs, that is to say, T=1/fs.

The generated control signal shown by line 560 corresponds to the envelope of the up-sampled rectified audio signal 554 and a delayed version of the audio signal. By generating the boost control signal from the envelope of the audio signal and the delayed signal, the boost voltage is increased prior to the audio signal arriving at the amplifier. The boosted voltage is held for a hold time until audio signal level decreases. By generating a booster control signal from the envelope of the audio signal and the delayed audio signal, the DC-DC-boost control voltage may be controlled with minimal headroom and consequently more efficiency without resulting in amplifier clipping. Since the resolution of the envelope may be less than the up-sampling frequency, the boost signal generator 500 uses a dual speed delay line 540 with two delay-stages 530, 530' running at different speeds. This may significantly reduce the complexity compared with boost signal generator 300.

Figure 9:
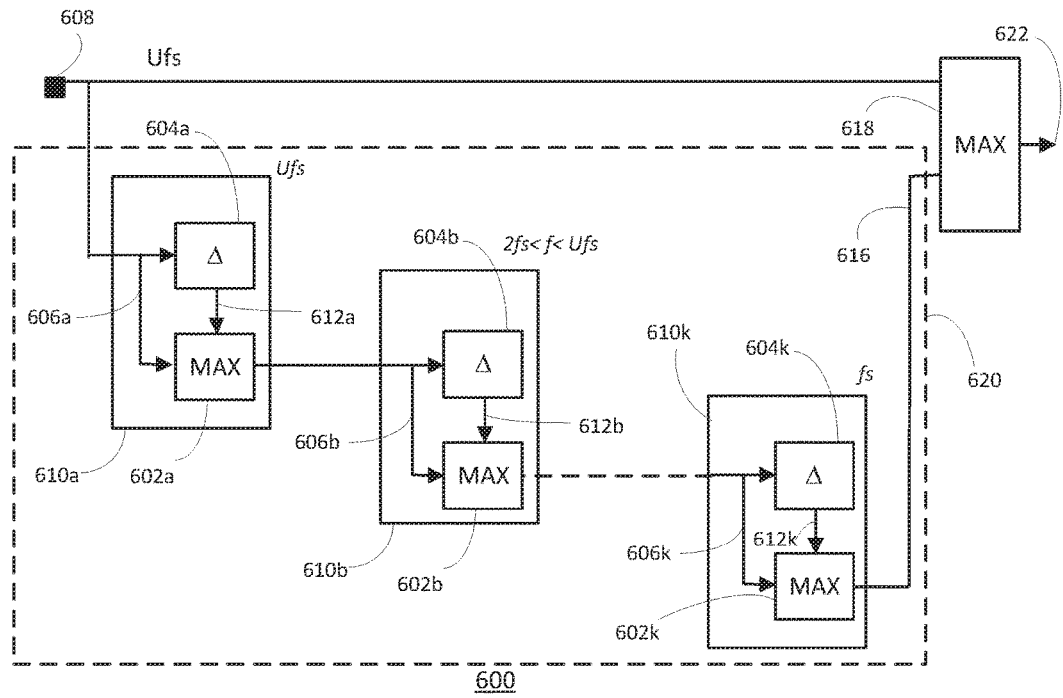
FIG. 9 shows a boost control signal generator according to an embodiment.

FIG. 9 shows a boost control signal generator 600. The boost control signal generator 600 may have an input 608 connected to a first input of the boost signal controller maximum value detector 618. The boost signal generator 600 may have a delay line 620 including k delay-stages 610a to 610k. Each delay-stage 610a to 610k may have a respective delay element 604a to 604k and a peak or maximum value detector 602a to 602k. The input 606a to 604k of each delay-stage may be connected to the respective delay element 604a to 604k. The input 606a to 606k of each delay-stage may be connected to the respective maximum value detector 602a to 602k. Each delay element output 612a to 612k may be connected to the respective maximum value detector 602a to 602k. The output of each delay stage maximum value detector 602a, 602b may be connected to the input of the following delay stage. The output of the final delay stage maximum value detector 602k may be connected to a second input of the boost signal controller maximum value detector 618. The boost signal controller maximum value detector 618 may have an output connected to the boost signal controller output 622.

In operation, an audio signal sampled at frequency fs may be up-sampled by an up-sample factor U and then rectified by determining the absolute value of each sample. The up-sampled signal may be received on the boost signal generator input 608. The first delay stage 604a, may operate at the up-sample frequency Ufs. The maximum value of the audio sampled in the first delay stage 604a is output to the second delay stage 614b. The second delay stage 610b may operate at a reduced sample frequency f in the range of between 2fs and less than Ufs. The maximum value of the audio sampled in the second delay stage 604b may be output to a further delay stage (not shown) which operates at a sample frequency between 2fs and the second stage sample frequency. The final delay stage 610k may operate at a sample frequency of fs. The total delay of the delay line 620 may be equal to the expected worst-case DC-DC-booster ramp-up time τ.

The boost signal controller maximum value detector 618 may determine the maximum value of the received up-sampled audio signal on the output of the delay line 620. The determined maximum value may be output on the boost control signal generator output.

The boost control signal generator 600 may determine the envelope of an audio signal which may control the DC-DC-boost voltage with minimum headroom and without clipping. By having multiple delay stages which down sample the determined maximum value, the complexity of the delay line 620 may be reduced.

Figure 10:
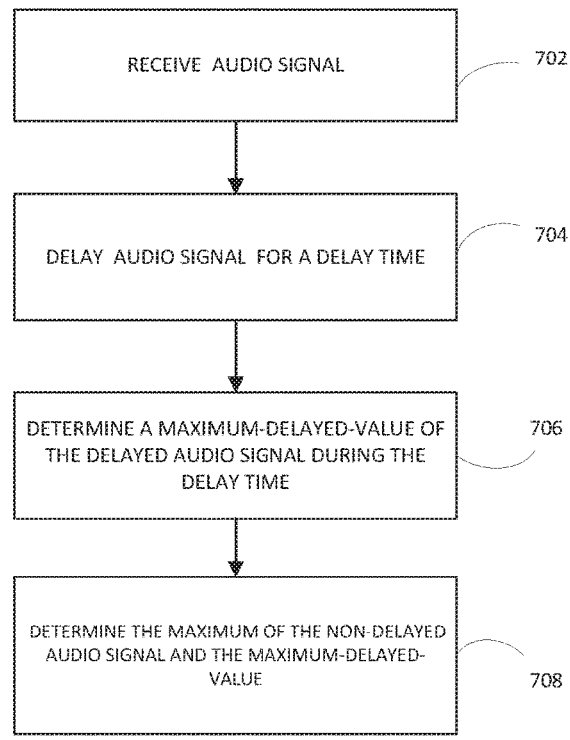
FIG. 10 shows a method of generating a boost control signal according to an embodiment.

FIG. 10 shows a method of generating a boost control signal 700. In step 702 an audio signal may be received. The audio signal may be an up-sampled audio signal. In step 704, the up-audio signal may be delayed for a delay time. In step 706, a maximum value of the audio signal may be determined during the delay time. In step 708 the maximum of the non-delayed audio signal and the maximum-delayed-value may be determined.

A method and operates for generating a boost control signal for a DC-DC-booster is described. An audio signal may be received comprising a plurality of audio sample values. The audio signal may be delayed for a delay time. A maximum-delayed-value of the audio sample values during the delay time may be determined. The boost control signal may be generated from the maximum of the non-delayed audio signal sample value and the maximum-delayed-value.

In some examples the audio signal may be delayed by a delay line implemented using shift registers as described. In other examples, it will be appreciated that a memory may be used to temporarily store the audio samples for a required delay time. It will be appreciated that the boost control signal generator may be implemented in hardware or by a combination of hardware and software. Examples of the boost control signal generator may be used to control a DC-DC booster in a mobile audio device. However, it will be appreciated that examples of the boost control signal generator may be included in any audio system including a DC-DC booster.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness, it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A boost control signal generator for controlling a DC-DC-booster, the boost control signal generator comprising:
   a boost control input configured to receive an audio signal comprising a plurality of audio sample values;
   a delay line having a delay line input coupled to the boost control input, at least one delay element coupled to the delay line input, a delay stage maximum value detector coupled to the at least one delay element, and a delay line output coupled to the delay stage maximum value detector, wherein the delay line is configured to output a maximum delayed value of the delayed audio sample values;
   a maximum value detector having a first input coupled to the boost control input, a second input coupled to the delay line output, and an output coupled to a boost control output, wherein the maximum value detector is configured to output a boost control signal value from a maximum of a maximum value of the plurality of audio sample values and the maximum delayed value.

2. The boost control signal generator of claim 1, wherein the delay line further comprises:
   a plurality of delay stages arranged between the delay line input and the delay line output, each of the plurality of delay-stages including;
   a delay-stage-input,
   a delay-stage-output, wherein the delay-stage-maximum-value-detector is coupled to the respective delay-stage-output, and, in operation, a sample rate of each subsequent delay stage is less than a sample rate of a preceding delay stage.

3. The boost control signal generator of claim 2, wherein each of the plurality of delay-stages comprises:
   at least one delay element, and each delay-stage-maximum-value-detector has at least one input coupled to the at least one delay element output and an input coupled to the delay-stage-input.

4. The boost control signal generator of claim 2, wherein the plurality of delay-stages comprises:
   a first delay-stage; and
   a second delay-stage, wherein the first delay-stage-input is coupled to the delay line input, the first delay-stage-output is coupled to the second delay-stage-input, the second delay-stage-output is coupled to the delay line output, and the second delay stage is configured to down-sample the output of the first delay stage.

5. The boost control signal generator of claim 4, wherein the first delay-stage is configured to receive an audio signal which has been up-sampled by an up-sampling factor, U, and the second delay-stage is configured to operate at the original audio sample frequency.

6. The boost control signal generator of claim 5, wherein the first delay-stage comprises only one delay element, the delay stage maximum value detector is arranged to feedback the peak value to the first delay-stage input, and the delay element is reset every U cycles.

7. The boost control signal generator of claim 6, wherein the first delay-stage comprises:
   a modulo-U counter coupled to a resettable delay element.

8. The boost control signal generator of claim 1, further comprising:
   an up-sampler having an audio signal input configured to receive an audio signal sampled at a sample frequency and an audio signal output coupled to the delay line input.

9. The boost control signal generator of claim 8, further comprising:
   an absolute value calculator having an input coupled to the up-sampler output and an output coupled tot the delay line input and the delay stage maximum value detector input.

10. A DC-DC-boost controller comprising the boost control signal generator of claim 1, wherein the DC-DC-boost controller is configured to vary the dc-supply to an audio amplifier in response to the generated boost control signal.

11. An audio amplifier comprising the DC-DC-boost controller of claim 9.

12. A method of generating a control signal for a DC-DC-boost controller, the method comprising:
   receiving an audio signal;
   delaying the audio signal for a delay time with a plurality of delay stages;
   determining, in a delay stage maximum value detector, a maximum value of the audio signal in each of the plurality of delay stages;
   providing the determined maximum value of the audio signal in each delay stage to succeeding delay stages of the plurality of delay stages; wherein a final maximum-delayed-value is a determined maximum value of a final delay stage of the plurality of delay stages;
   and
   determining a boost control signal value from a maximum of the non-delayed audio signal and the final maximum-delayed-value.

* * * * *